(12) United States Patent
Hayashi

(10) Patent No.: US 8,927,181 B2
(45) Date of Patent: Jan. 6, 2015

(54) REFLECTIVE MASK BLANK FOR EUV LITHOGRAPHY

(71) Applicant: Asahi Glass Company, Limited, Chiyoda-ku (JP)

(72) Inventor: Kazuyuki Hayashi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 145 days.

(21) Appl. No.: 13/775,412

(22) Filed: Feb. 25, 2013

(65) Prior Publication Data

US 2013/0164660 A1 Jun. 27, 2013

Related U.S. Application Data

(63) Continuation of application No. PCT/JP2011/068967, filed on Aug. 23, 2011.

(30) Foreign Application Priority Data

Aug. 24, 2010 (JP) ................... 2010-187049

(51) Int. Cl.
*G03F 1/24* (2012.01)
*G03F 1/22* (2012.01)
*G03F 1/54* (2012.01)

(52) U.S. Cl.
CPC ... *G03F 1/24* (2013.01); *G03F 1/54* (2013.01)
USPC ............................................................ 430/5

(58) Field of Classification Search
USPC .................. 430/5, 322; 378/35; 428/432
See application file for complete search history.

(56) References Cited

U.S. PATENT DOCUMENTS

| | | |
|---|---|---|
| 5,641,593 A | 6/1997 | Watanabe et al. |
| 7,390,596 B2 | 6/2008 | Ishibashi et al. |
| 7,713,666 B2 | 5/2010 | Hayashi et al. |
| 7,718,324 B2 | 5/2010 | Hayashi et al. |
| 7,833,682 B2 | 11/2010 | Hayashi et al. |
| 7,855,036 B2 | 12/2010 | Hayashi et al. |
| 7,906,259 B2 | 3/2011 | Hayashi et al. |
| 8,133,643 B2 | 3/2012 | Hayashi |

(Continued)

FOREIGN PATENT DOCUMENTS

| | | |
|---|---|---|
| JP | 3078163 | 8/2000 |
| JP | 2002-299227 | 10/2002 |

(Continued)

OTHER PUBLICATIONS

U.S. Appl. No. 13/739,373, filed Jan. 11, 2013, Hayashi.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

To provide a reflective mask blank for EUV lithography having an absorber layer having optical constants suitable for reducing the thickness. A mask blank for EUV lithography comprising a substrate, and a reflective layer for reflecting EUV light and an absorber layer for absorbing EUV light formed in this order on the substrate, wherein the absorber layer contains tantalum (Ta) and palladium (Pd), and in the absorber layer, the content of tantalum (Ta) is from 10 to 80 at %, the content of palladium (Pd) is from 20 to 90 at %, and the total content of Ta and Pd is from 95 to 100 at %.

22 Claims, 1 Drawing Sheet

(56) References Cited

U.S. PATENT DOCUMENTS

| | | |
|---|---|---|
| 8,168,352 B2 | 5/2012 | Hayashi |
| 8,227,152 B2 | 7/2012 | Hayashi |
| 8,288,062 B2 | 10/2012 | Hayashi et al. |
| 2005/0208389 A1 | 9/2005 | Ishibashi et al. |
| 2006/0251973 A1 | 11/2006 | Takaki et al. |
| 2008/0248409 A1 | 10/2008 | Ishibashi et al. |
| 2010/0035165 A1 | 2/2010 | Hayashi et al. |
| 2010/0304283 A1 | 12/2010 | Hayashi et al. |
| 2011/0070534 A1 | 3/2011 | Hayashi |
| 2011/0104595 A1 | 5/2011 | Hayashi et al. |
| 2012/0322000 A1 | 12/2012 | Uno et al. |

FOREIGN PATENT DOCUMENTS

| | | |
|---|---|---|
| JP | 2004-006798 | 1/2004 |
| JP | 2006-228766 | 8/2006 |
| JP | 2009/210802 | 9/2009 |
| WO | WO 2010/007955 | 1/2010 |

OTHER PUBLICATIONS

U.S. Appl. No. 14/288,908, filed May 28, 2014, Hayashi.
International Search Report issued Sep. 20, 2011 in PCT/JP2011/068967 filed Aug. 23, 2011.

REFLECTIVE MASK BLANK FOR EUV LITHOGRAPHY

FIELD OF INVENTION

The present invention relates to a reflective mask blank for EUV (Extreme Ultra Violet) lithography (in this specification, hereinafter also referred to as "EUV mask blank") to be used for e.g. production of semiconductors, and a reflective mask (in this specification, hereinafter also referred to as "EUV mask") obtained by forming in an absorber layer of such an EUV mask blank.

BACKGROUND OF INVENTION

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices has been accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. From this point of view, EUV lithography, which is an exposure technique employing EUV light having a wavelength further shorter than ArF laser, is expected to be prospective as a next generation exposure technique for 45 nm or below. In this specification, EUV light means a light ray having a wavelength within a soft X-ray region or within a vacuum ultraviolet region, specifically a light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional dioptric system like photolithography employing visible light or ultraviolet light. For this reason, for EUV lithography, a catoptric system, i.e. a reflective photomask (hereinafter also referred to as "EUV mask") and a mirror, is employed.

A mask blank is a stacked structure for a photomask, which has not been patterned yet. In the case of an EUV mask blank, it has a structure wherein a reflective layer for reflecting EUV light and an absorber layer for absorbing EUV light, are formed in this order on a substrate made of e.g. glass (Patent Document 1). As the absorber layer, a material having a high extinction coefficient for EUV light, specifically, for example, a material having Ta as the main component, is used.

Patent Document 1 discloses that a tantalum-boron alloy nitride (TaBN), a tantalum-boron alloy oxide (TaBO) and a tantalum-boron alloy oxynitride (TaBNO) are preferably used as a material of the absorber layer since they have a high extinction coefficient for EUV light and a low reflectivity for deep ultraviolet light at a wavelength region (190 nm to 260 nm) of pattern inspection light.

Recently, in an EUV mask blank, the thickness of the absorber layer has been desired to be reduced. In EUV lithography, an EUV mask is irradiated with exposure light not from a perpendicular direction to the EUV mask but from a direction at an angle of a few degrees, usually 6 degrees, to the perpendicular direction. If the thickness of the absorber layer is thick, at the time of EUV lithography, a shadow by the exposure light arises on a mask pattern formed by removing a part of the absorber layer by etching, and the form accuracy or the dimension accuracy of a mask pattern (hereinafter referred to as "transfer pattern") to be transferred to a resist on a substrate such as a Si wafer by using the EUV mask, tends to be deteriorated. Since this problem becomes more significant as the line width of the mask pattern formed on the EUV mask becomes smaller, the thickness of the absorber layer of the EUV mask blank is required to be more reduced.

Ideally, a material having a high extinction coefficient for EUV light should be employed for the absorber layer of the EUV mask blank, and the thickness should be such that EUV light applied to the surface of the absorber layer is completely absorbed. However, as described above, since the thickness of the absorber layer is required to be reduced, the EUV light applied to the layer is not completely absorbed by the absorber layer, and a part of the EUV light becomes reflection light.

What is required when a transfer pattern is formed on a resist on a substrate by EUV lithography is the contrast of reflection light in the EUV mask, that is, the contrast between reflection light from a portion of the mask wherein the absorber layer is removed at the time of forming the mask pattern so that the reflective layer is exposed to the outside, and reflection light from a portion of the mask wherein the absorber layer is not removed at the time of forming the mask pattern. Accordingly, it has been considered that so long as a sufficient contrast of reflection light is secured, there is no problem even if the applied EUV light is not completely absorbed by the absorber layer.

Based on the above concept, an EUV mask using the principle of phase shift to reduce the thickness of the absorber layer is proposed (Patent Documents 2 and 3). Such an EUV mask is characterized in that the reflectivity for reflection light from the portion wherein the absorber layer is not removed at the time of forming a mask pattern is from 3 to 15% and that the phase difference between the reflection light from the portion wherein the absorber layer is not removed at the time of forming a mask pattern and the reflection light from the portion wherein the absorber layer is removed at the time of forming the mask pattern so that the reflective layer is exposed to the outside is from 175 to 185 degrees. It is disclosed that in such an EUV mask, the principle of phase shift is applied to the reflection light from the absorber layer, whereby it is possible to sufficiently maintain the contrast with the reflection light from the reflective layer and that it is thereby possible to reduce the thickness of the absorber layer.

PRIOR ART DOCUMENTS

Patent Documents

Patent Document 1: JP-A-2004-6798
Patent Document 2: JP-A-2006-228766
Patent Document 3: JP-B-3078163

SUMMARY OF INVENTION

Technical Problem

However, in a case of an absorber layer containing Ta as the main component as disclosed in Patent Document 1, it is said that the limit of the minimum thickness of the absorber layer is from 50 to 60 nm. The limit of the thickness in the case of reducing the thickness of the absorber layer is largely depends upon the refractive index n of the metal to be the main component and the extinction coefficient k.

Generally the phase difference between the reflective layer and the absorber layer is represented by the following formula:

$$\phi = 4\pi(1-n) \times d \times \cos\theta/\lambda$$

wherein φ is a phase difference, n is a refractive index of the absorber layer, d is a thickness of the absorber layer, θ is an incident angle of EUV light, and λ is a wavelength of EUV light.

When the phase difference φ is 180 degrees (=π), the reflection contrast reaches its maximum. The thickness at this time is represented by the following formula:

$$d = \lambda/4(1-n) \times \cos\theta$$

That is, a smaller refractive index n of the absorber layer is advantageous for reducing the thickness of the absorber layer. For example, in a case of an absorber layer containing Ta as the main component, since the refractive index is n=0.945, the thickness may be more reduced when the refractive index of the absorber layer is less than 0.945. Further, the extinction coefficient k is preferably k=0.020 to 0.080 to obtain a reflectivity of from 2 to 30%.

Accordingly, the absorber layer preferably has a refractive index of less than 0.945 and an extinction coefficient k of from 0.020 to 0.080 for reducing the thickness.

Patent Document 2 has a description about ranges of optical constants regarded as being optimal as a halftone film but no description about a specific material. On the other hand, Patent Document 3 discloses that a material comprising one element selected from the group consisting of V, Cr, Mn, Fe, Co, Ag, Cd, In, Sn, Sb, lanthanoid elements, Hf, Ta, W, Re, Os, Ir, Pt, Au, TI, Pb and Bi, or a substance containing at least one element among the above elements, is preferred.

However, since the properties required for the absorber layer are not only optical properties for EUV light but are various such as "surface roughness", "film stress", "crystalline state of the layer" and "optical properties at wavelength region of pattern inspection light", it is difficult to satisfy all the properties by one type of metal, and accordingly it is important to use an alloy having some types of metals in combination. In Patent Document 3, there is no disclosure about specific combination of such materials.

In order to solve the above problems of conventional art, the present invention is to provide an EUV mask blank which has excellent properties as an EUV mask blank, particularly which has an absorber layer having optical constants by which reduction of the thickness may be more expected than a conventional absorber layer, and which satisfies various properties such as "surface roughness", "film stress", "crystalline state of the layer" and "optical properties at wavelength region of pattern inspection light", which are required for the absorber layer.

Solution to Problem

The present inventors have conducted an extensive study to solve the above problems and as a result, have found that when an absorber layer contains specific amounts of tantalum (Ta) and palladium (Pd), desired optical constants may be obtained, and further, various properties required for the absorber layer for an EUV mask blank may be satisfied.

The present invention has been made based on the above discovery, and provides a mask blank for EUV lithography (hereinafter referred to as "the EUV mask blank of the present invention") comprising a substrate, and a reflective layer for reflecting EUV light and an absorber layer for absorbing EUV light formed in this order on the substrate, wherein the absorber layer contains tantalum (Ta) and palladium (Pd), and in the absorber layer, the content of tantalum (Ta) is from 10 to 80 at %, the content of palladium (Pd) is from 20 to 90 at %, and the total content of Ta and Pd is from 95 to 100 at %.

In the EUV mask blank of the present invention, it is preferred that the absorber layer further contains nitrogen (N).

It is preferred that in the absorber layer, the content of tantalum (Ta) is from 10 to 60 at %, the content of palladium (Pd) is from 20 to 70 at %, the content of nitrogen (N) is from 20 to 70 at %, and the total content of Ta, Pd and N is from 95 to 100 at %.

In the EUV mask blank of the present invention, it is preferred that the absorber layer further contains hydrogen (H).

It is preferred that in the absorber layer, the content of tantalum (Ta) is from 10 to 79.9 at %, the content of palladium (Pd) is from 20 to 89.9 at %, the content of hydrogen (H) is from 0.1 to 10 at %, and the total content of Ta, Pd and H is from 95 to 100 at %.

In the EUV mask blank of the present invention, it is preferred that the absorber layer further contains nitrogen (N) and hydrogen (H).

It is preferred that in the absorber layer, the content of tantalum (Ta) is from 10 to 59.9 at %, the content of palladium (Pd) is from 20 to 69.9 at %, the content of nitrogen (N) is from 20 to 69.9 at %, the content of hydrogen (H) is from 0.1 to 10 at %, and the total content of Ta, Pd, N and H is from 95 to 100 at %.

In the EUV mask blank of the present invention, it is preferred that the crystalline state of the absorber layer is amorphous.

Further, in the EUV mask blank of the present invention, it is preferred that the surface roughness (rms) of the surface of the absorber layer is at most 0.5 nm.

The surface roughness (rms) is more preferably at most 0.45 nm, further preferably at most 0.4 nm.

Further, in the EUV mask blank of the present invention, it is preferred that the absorber layer has a thickness of from 20 to 50 nm.

In the EUV mask blank of the present invention, it is preferred that a low reflective layer for inspection light to be used for inspection of a mask pattern, is formed on the absorber layer, and the low reflective layer contains at least one member selected from the group consisting of tantalum (Ta), palladium (Pd), silicon (Si) and hafnium (Hf), and at least one member selected from the group consisting of oxygen (O) and nitrogen (N).

It is preferred that in the low reflective layer, the total content of tantalum (Ta), palladium (Pd), silicon (Si) and hafnium (Hf) is from 10 to 55 at %, the total content of oxygen (O) and nitrogen (N) is from 45 to 90 at %, and the total content of Ta, Pd, Si, O and N is from 95 to 100 at %.

Further, in the case where a low reflective layer is formed on the absorber layer, it is preferred that the surface roughness (rms) of the surface of the low reflective layer is at most 0.5 nm.

Further, in the case where a low reflective layer is formed on the absorber layer, it is preferred that the low reflective layer has a thickness of from 5 to 30 nm.

In the case where a low reflective layer is formed on the absorber layer, it is preferred that the reflectivity on the surface of the low reflective layer at a wavelength of the light to be used for inspection of a pattern formed in the absorber layer is at most 15%.

Further, in the EUV mask blank of the present invention, it is preferred that a protective layer for protecting the reflective layer at the time of forming a pattern in the absorber layer, is formed between the reflective layer and the absorber layer, and the contrast between reflection light on the surface of the protective layer and reflection light on the surface of the low reflective layer at a wavelength of the light to be used for inspection of a pattern formed in the absorber layer is at least 30%.

In the case where a protective layer is formed between the reflective layer and the absorber layer, it is preferred that the protective layer is formed from at least one member selected from the group consisting of Ru, a Ru compound and $SiO_2$.

In the EUV mask blank of the present invention, it is preferred that the absorber layer is formed by carrying out a sputtering method by using a target containing tantalum (Ta) and palladium (Pd) in an inert gas atmosphere containing at least one member selected from the group consisting of helium (He), argon (Ar), neon (Ne), krypton (Kr) and xenon (Xe).

In the EUV mask blank of the present invention, in the case where the absorber layer contains nitrogen (N), it is preferred that the absorber layer is formed by carrying out a sputtering method by using a target containing tantalum (Ta) and palladium (Pd) in an inert gas atmosphere containing nitrogen ($N_2$) and at least one member selected from the group consisting of helium (He), argon (Ar), neon (Ne), krypton (Kr) and xenon (Xe).

In the EUV mask blank of the present invention, in the case where the absorber layer contains hydrogen (H), it is preferred that the absorber layer is formed by carrying out a sputtering method by using a target containing tantalum (Ta) and palladium (Pd) in an inert gas atmosphere containing hydrogen ($H_2$) and at least one member selected from the group consisting of helium (He), argon (Ar), neon (Ne), krypton (Kr) and xenon (Xe).

In the EUV mask blank of the present invention, in the case where the absorber layer contains hydrogen (H) and nitrogen (N), it is preferred that the absorber layer is formed by carrying out a sputtering method by using a target containing tantalum (Ta) and palladium (Pd) in an inert gas atmosphere containing hydrogen ($H_2$), nitrogen ($N_2$) and at least one member selected from the group consisting of helium (He), argon (Ar), neon (Ne), krypton (Kr) and xenon (Xe).

In the case where the low reflective layer containing at least one member selected from the group consisting of tantalum (Ta), palladium (Pd), silicon (Si) and hafnium (Hf), and at least one member selected from the group consisting of oxygen (O) and nitrogen (N) is formed on the absorber layer, it is preferred that the low reflective layer is formed by carrying out a sputtering method by using a target containing at least one member selected from the group consisting of tantalum (Ta), palladium (Pd), silicon (Si) and hafnium (Hf) in an inert gas atmosphere containing at least one member selected from the group consisting of helium (He), argon (Ar), neon (Ne), krypton (Kr) and xenon (Xe) and at least one member selected from the group consisting of oxygen ($O_2$) and nitrogen ($N_2$).

Advantageous Effects of Invention

The EUV mask blank of the present invention has a smaller value of the refractive index and a more desired extinction coefficient as compared with a conventional absorber layer containing Ta as the main component, whereby it is possible to obtain a reduced thickness as compared with the conventional absorber layer, and it is possible to improve the form accuracy and dimension accuracy of a mask transfer pattern to be transferred to a resist on a substrate such as a Si wafer.

DETAILED DESCRIPTION OF INVENTION

In the following, the EUV mask blank of the present invention will be described with reference to drawings.

Figure 1:
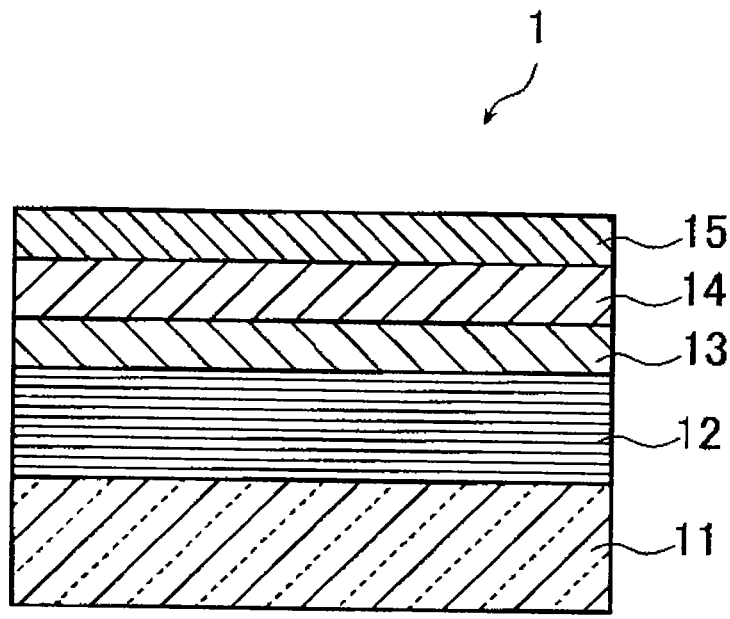
FIG. 1 is a cross-sectional view schematically illustrating an embodiment of an EUV mask blank 1 of the present invention.

FIG. 1 is a cross-sectional view schematically illustrating an embodiment of the EUV mask blank of the present invention. The mask blank 1 shown in FIG. 1 comprises a substrate 11, and a reflective layer 12 for reflecting EUV light and an absorber layer 14 for absorbing EUV light formed in this order on the substrate 11. Between the reflective layer 12 and the absorber layer 14, a protective layer 13 for protecting the reflective layer 12 at the time of forming a pattern in the absorber layer 14, is formed. On the absorber layer 14, a low reflective layer 15 for inspection light to be used for inspection of a mask pattern is formed. It should be noted, however, that in the EUV mask blank 1 of the present invention, only the substrate 11, the reflective layer 12 and the absorber layer 14 are essential in the construction shown in FIG. 1, and the protective layer 13 and the low reflective layer 15 are optional constituents.

Now, the respective constituents in the mask blank 1 will be described.

The substrate 11 is required to satisfy the characteristics that a substrate of an EUV mask blank should possess. Accordingly, the substrate 11 is preferably made of a low-expansive material having a thermal expansion coefficient of $0\pm0.05\times10^{-7}/°$ C., particularly preferably $0\pm0.03\times10^{-7}/°$ C., at 20° C. Further, the substrate 11 is preferably excellent in smoothness, flatness and resistance to a cleaning liquid used for cleaning the mask blank or the photomask after formation of a pattern. As the substrate 11, specifically, glass having a low thermal expansion coefficient such as $SiO_2$—$TiO_2$ glass may be used. However, it is not limited to such glass, but a substrate of crystallized glass having a β quartz solid solution precipitated, quartz glass, silicon, a metal or the like may also be employed.

The substrate 11 preferably has a smooth surface having a surface roughness (rms) of at most 0.15 nm and a flatness of at most 100 nm, for the purpose of obtaining a high reflectivity and a high transfer accuracy in a photomask after formation of a pattern.

The size, the thickness, etc. of the substrate 11 is appropriately determined depending on the design values of the mask. In Examples described later, $SiO_2$—$TiO_2$ glass having an external size of about 6 inch (152 mm) square and the thickness of about 0.25 inch (6.3 mm) was used.

It is preferred that no defect is present on a surface of the substrate 11 on which the reflective layer 12 is to be formed. However, even if defects are present, in order to prevent formation of phase defects due to concave defects and/or convex defects, the depth of such concave defects and the height of such convex defects are preferably at most 2 nm, and the half width of the size in the plane direction of such concave defects and convex defects is preferably at most 60 nm.

The reflective layer 12 is not particularly limited so long as it has a desired characteristics as a reflective layer of an EUV mask blank. Here, the characteristics particularly required for the reflective layer 12 is having a high EUV light reflectivity. Specifically, when the surface of the reflective layer 12 is irradiated with light at a wavelength region of EUV light at an incident angle of 6 degrees, the maximum value of the light reflectivity at a wavelength in the vicinity of 13.5 nm is preferably at least 60%, more preferably at least 65%. Further, even in a case where a protective layer 13 is provided on the reflective layer 12, the maximum value of the light reflectivity at a wavelength in the vicinity of 13.5 nm is preferably at least 60%, more preferably at least 65%.

As the reflective layer 12, a multilayer reflective film having a plurality of high refractive index layers and low refractive index layers alternately stacked is usually employed with a view to achieving high EUV light reflectivity. In the multilayer reflective film composing the reflective layer 12, Si is widely used for the high refractive index layers, and Mo is widely used for the low refractive index layers. (Hereinafter in this specification, a reflective layer having a plurality of high refractive index layers and low refractive index layers alternately stacked will be also referred to simply as "Si/Mo multilayer reflective film") Namely, a Si/Mo multilayer reflective film is the most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may also be employed.

The film thickness of each layer and the number of repeating units of the layers constituting the multilayer reflective film composing the reflective layer 12, may be appropriately selected according to the film material to be used and the EUV light reflectivity required for the reflective layer. In a case of Si/Mo reflective film, for example, a reflective layer 12 having a maximum value of EUV light reflectivity of at least 60% may be obtained by depositing a multilayer reflective film wherein a Mo layer having a thickness of 2.3±0.1 nm and a Si layer having a thickness of 4.5±0.1 nm are alternately stacked so that the number of repeating units becomes from 30 to 60.

Here, layers constituting the multilayer reflective film composing the reflective layer 12 may be each film-formed by a known film-deposition method such as a magnetron sputtering method or an ion beam sputtering method so as to have a desired thickness. For example, in a case of depositing a Si/Mo multilayer reflective film by using an ion beam sputtering method, it is preferred that a Si film is deposited by using a Si target as a target and Ar gas (gas pressure: $1.3 \times 10^{-2}$ Pa to $2.7 \times 10^{-2}$ Pa) as a sputtering gas under an ion acceleration voltage of from 300 to 1,500 V at a film-deposition rate of from 0.03 to 0.30 nm/sec to have a thickness of 4.5 nm, and subsequently a Mo film is deposited by using a Mo target as a target and Ar gas (gas pressure: $1.3 \times 10^{-2}$ Pa to $2.7 \times 10^{-2}$ Pa) as a sputtering gas under an ion acceleration voltage of from 300 to 1,500 V at a film-deposition rate of from 0.03 to 0.30 nm/sec so as to have a thickness of 2.3 nm. Taking the above process as one cycle, from 40 to 50 cycles of deposition of a Si film and a Mo film are carried out to form a Si/Mo multilayer reflective film.

In order to prevent oxidization of a surface of the reflective layer 12, the uppermost layer of the multilayer reflective film composing the reflective layer 12 is preferably a layer made of a material hard to be oxidized, or a layer composed of such a material is preferably formed as the uppermost layer. The layer made of a material hard to be oxidized functions as a cap layer of the reflective layer 12. As a specific example of the layer made of a material hard to be oxidized functioning as a cap layer, a Si layer may be mentioned. When the multilayer reflective film composing the reflective layer 12 is a Si/Mo film, by providing a Si layer as the uppermost layer, it is possible to allow the uppermost layer to function as a cap layer. In this case, the film thickness of the cap layer is preferably 11±2 nm.

The protective layer 13 is provided for the purpose of protecting the reflective layer 12 so that the reflective layer 12 is not damaged by etching at the time of forming a mask pattern in the absorber layer 14 by etching, usually dry etching. Accordingly, as the material of the protective layer 13, a material that is less susceptible to etching of the absorber layer 14, that is, a material having an etching rate lower than that of the absorber layer 14 and being hard to be damaged by the etching, is used. As a material satisfying such a condition, Al and/or a nitride thereof, Ru and/or Ru compounds (RuB, RuSi, RuNb, etc.), and $SiO_2$, $Si_3N_4$, $Al_2O_3$ and a mixture thereof may, for example, be mentioned. Among them, Ru and Ru compounds and $SiO_2$ are preferred. Here, as described later, since in the EUV mask blank of the present invention, the absorber layer contains Pd, such a material is particularly preferably Ru or a Ru compound (such as RuB, RuSi or RuNb) because of the etching resistance. Such a Ru compound is preferably at least one member selected from the group consisting of RuB, RuSi, RuNb and RuZr. That is, for etching of an absorber layer containing Pd as the absorber layer 14 of the present invention, dry etching using a fluorine type gas ($CF_4$, $CF_3H$) is preferably employed, and a protective layer 13 having Ru and/or a Ru compound as a constituent material is preferred because it has sufficient etching resistance against dry etching using such a fluorine type gas, and etching damage is little.

Further, the protective layer 13 preferably contains no Ta or Cr in order to prevent increase in film stress. In a case where Ta and Cr are contained, each of the contents of Ta and Cr in the protective layer 13 is preferably at most 5 at %, particularly preferably at most 3 at %, and it is further preferred that no Ta or Cr is contained.

The thickness of the protective layer 13 is preferably from 1 to 60 nm, particularly preferably from 1 to 10 nm.

The protective layer 13 is formed by using a known film-deposition method such as a magnetron sputtering method or an ion beam sputtering method. In a case of depositing Ru film by a magnetron sputtering method, the film is preferably deposited by using a Ru target as a target and Ar gas (gas pressure: $1.0 \times 10^{-2}$ Pa to $10 \times 10^{-1}$ Pa) as a sputtering gas under an input power of from 30 to 1,500 V at a film-deposition rate of from 0.02 to 1.0 nm/sec so as to have a thickness of from 2 to 5 nm.

The properties particularly required for the absorber layer 14 is such that the contrast between EUV light reflected on the reflective layer 12 and EUV light reflected on the absorber layer 14 is high. In a case of an EUV mask not wherein EUV light is absorbed only by the absorber layer 14 but wherein the contrast with on the reflective layer 12 is maintained by using the principle of phase shift, the refractive index n and the extinction coefficient k of the absorber layer are required to be desired values, as described above. n is preferably less than 0.945, more preferably less than 0.930, further preferably less than 0.920. k is preferably from 0.020 to 0.080, more preferably from 0.025 to 0.078, further preferably from 0.030 to 0.075.

Further, in order to use the principle of phase shift, the maximum value of the reflectivity for EUV reflection light on the surface of the absorber layer 14, specifically, the light reflectivity at a wavelength in the vicinity of 13.5 nm when the surface of the absorber layer 14 is irradiated with a light at a wavelength range of EUV light at an incident angle of 6 degrees is from 3 to 15%, preferably from 4 to 12%.

The absorber layer 14 of the EUV mask blank 1 of the present invention achieves the above properties by containing specific amounts of tantalum (Ta) and palladium (Pd).

In a case where a low reflective layer 15 is formed on the absorber layer 14, the reflectivity for EUV reflection light on the surface of the low reflective layer 15 preferably satisfies the above range.

The content of tantalum (Ta) in the absorber layer 14 is preferably from 10 to 80 at %, particularly preferably from 10 to 75 at %, furthermore preferably from 10 to 70 at %, because it is thereby possible to control the surface roughness of the absorber layer, the film stress and the crystalline state of the layer to be within after-mentioned desirable range, and it is thereby possible to control the optical properties at a wavelengths range of EUV light to be within the above-described desirable range.

Further, the content of palladium (Pd) is preferably from 20 to 90 at %, particularly preferably from 25 to 90 at %, furthermore preferably from 30 to 90 at %, because it is thereby possible to control the optical constants (n<0.945, k=0.030 to 0.080) to be suitable for reducing the thickness of the absorber layer.

Further, the total content of Ta and Pd in the absorber layer 14 is preferably from 95 to 100 at %, more preferably from 97 to 100 at %, furthermore preferably from 99 to 100 at %.

Further, it is preferred that the absorber layer 14 contains no Cr with a view to preventing increase in film stress. The content of Cr in the absorber layer 14 is preferably at most 5 at %, particularly preferably at most 3 at %, and it is further preferred that no Cr is contained.

The absorber layer 14 may further contain nitrogen (N). When N is contained, an effect of improving the surface roughness may be obtained. In the case where the absorber layer 14 contains N, the content of N is preferably from 20 to 70 at %, particularly preferably from 25 to 70 at %, with a view to obtaining smooth surface of the absorber layer.

In the case where the absorber layer 14 contains N, it is preferred that in the absorber layer 14, the content of Ta is from 10 to 60 at %, and the content of Pd is from 20 to 70 at %, and particularly, it is further preferred that the content of Ta is from 10 to 55 at %, and the content of Pd is from 20 to 65 at %.

In the case where the absorber layer 14 contains N, the total content of Ta, Pd and N in the absorber layer 14 is preferably from 95 to 100 at %, more preferably from 97 to 100 at %, further preferably from 99 to 100 at %.

The absorber layer 14 may further contain hydrogen (H). When the absorber layer 14 contains H, an effect of obtaining a crystalline state of amorphous may be obtained. In the case where the absorber layer 14 contains H, the content of H is preferably from 0.1 to 10 at %, particularly preferably from 0.1 to 5 at %, with a view to obtaining an absorber layer having a crystalline structure of amorphous and obtaining a smooth surface roughness of the absorber layer.

In the case where the absorber layer 14 contains H, it is preferred that in the absorber layer 14, the content of Ta is from 10 to 79.9 at %, and the content of Pd is from 20 to 89.9 at %, and particularly, it is further preferred that the content of Ta is from 10 to 74.9 at %, and the content of Pd is from 25 to 89.9 at %.

In the case where the absorber layer 14 contains H, the total content of Ta, Pd and H in the absorber layer 14 is preferably from 95 to 100 at %, more preferably from 97 to 100 at %, further preferably from 99 to 100 at %.

In the case where the absorber layer 14 contains N and H, it is preferred that the content of N is from 20 to 69.9 at %, and the content of H is from 0.1 to 10 at %, with a view to obtaining smooth surface of the absorber layer, and it is particularly preferred that the content of N is from 20 to 64.9 at %, and the content of H is from 0.1 to 5 at %.

In the case where the absorber layer 14 contains N and H, it is preferred that in the absorber layer 14, the content of Ta is from 10 to 59.9 at %, and the content of Pd is from 20 to 69.9 at %, and particularly, it is further preferred that the content of Ta is from 10 to 54.9 at %, and the content of Pd is from 25 to 69.9 at %.

In the case where the absorber layer 14 contains N and H, the total content of Ta, Pd, N and H in the absorber layer 14 is preferably from 95 to 100 at %, more preferably from 97 to 100 at %, further preferably from 99 to 100 at %.

Further, the content of oxygen in the absorber layer 14 is preferably at most 5 at %, particularly preferably at most 3 at %, with a view to preventing the absorber layer from being insulating. Further, the content of oxygen in the protective layer 13 is also preferably at most 5 at %, particularly preferably at most 3 at %.

The absorber layer 14 has the above construction, whereby its crystalline state is preferably amorphous. In this specification, "having a crystalline state of amorphous" means having an amorphous structure and having no crystal structure, or having a microcrystal structure. When the absorber layer 14 is a film having an amorphous structure or a film having a microcrystal structure wherein microcrystal is partially contained in an amorphous structure, the surface of the absorber layer 14 has excellent smoothness. Hereinafter, "a microcrystal structure" means "a structure wherein microcrystal is partially contained in an amorphous structure".

The absorber layer of the present invention is also preferably a film containing only metals such as tantalum (Ta) and palladium (Pd) because it is thereby possible to obtain the crystalline state of the film of amorphous. That is, it is possible to obtain an absorber layer having a crystalline state of amorphous even when the absorber layer does not contain a material by which the film property is likely to be amorphous, such as B or Si.

In the EUV mask blank 1 of the present invention, it is preferred that the absorber layer 14 is a film having an amorphous structure or a film having a microcrystal structure, and the surface roughness (rms) of the surface of the absorber layer 14 is at most 0.5 nm. The surface roughness of the surface of the absorber layer 14 can be measured by using an atomic force microscope. If the surface roughness of the surface of the absorber layer 14 is large, the edge roughness of the pattern to be formed in the absorber layer 14 tends to be large, whereby the dimension accuracy of the pattern may deteriorate. As the pattern becomes fine, the influence of the edge roughness tends to be distinct, and accordingly the surface of the absorber layer 14 is required to be smooth.

When the surface roughness (rms) of the surface of the absorber layer 14 is at most 0.5 nm, the surface of the absorber layer 14 is sufficiently smooth, and thus the dimension accuracy of the pattern will not deteriorate due to the influence of the edge roughness. The surface roughness (rms) of the surface of the absorber layer 14 is more preferably at most 0.4 nm, further preferably at most 0.3 nm.

Whether the crystalline state of the absorber layer is amorphous, i.e. whether the absorber layer has an amorphous structure or a microcrystal structure, may be determined by an X-ray diffraction (XRD) method. When the crystalline state of the absorber layer 14 is an amorphous structure or a microcrystal structure, no sharp peak will be observed among the diffraction peaks obtained by the XRD measurement.

The film stress of the absorber layer 14 is preferably within ±200 MPa, particularly preferably within ±180 MPa, because the form accuracy and the dimension accuracy of a mask transfer pattern to be transferred to a resist formed on a substrate such as a Si wafer will thereby not deteriorate.

The thickness of the absorber layer 14 is preferably from 20 to 50 nm, particularly preferably from 20 to 45 nm, further preferably from 20 to 40 nm, because it is expected that the form accuracy and the dimension accuracy of a mask transfer pattern to be transferred to a resist on a substrate such as a Si wafer will be thereby improved.

The absorber layer 14 having the above construction may be formed by carrying out a sputtering method by using a target containing Ta and/or Pd. "Using a target containing Ta and/or Pd" includes all of using two types of metal targets i.e. a Ta target and a Pd target separately, using a Ta target containing a component other than Ta and a target containing a component other than Pd separately, and using a compound target containing Ta and Pd such as a Ta—Pd alloy target.

It is advantageous to use two types of metal targets separately to control the components of the absorber layer 14. In a case of using two types of metal targets, the components of the absorber layer 14 may be controlled by adjusting the input power for the target. On the other hand, in a case of using a compound target, it is preferred to preliminarily adjust the target composition so that the absorber layer 14 to be formed will have a desired composition.

The sputtering method using the above target is carried out in an inert gas atmosphere containing at least one member selected from the group consisting of helium (He), argon (Ar), neon (Ne), krypton (Kr) and xenon (Xe). However, in a case of forming an absorber layer containing N, sputtering method is carried out in an inert gas atmosphere containing nitrogen ($N_2$) and at least one member selected from the group consisting of He, Ar, Ne, Kr and Xe. Further, in a case of forming an absorber layer containing H, a sputtering method is carried out in an inert gas atmosphere containing hydrogen ($H_2$) and at least one member selected from the group consisting of He, Ar, Ne, Kr and Xe. Further, in a case of forming an absorber layer containing H and N, a sputtering method is carried out in an inert gas atmosphere containing hydrogen ($H_2$), nitrogen ($N_2$) and at least one member selected from the group consisting of He, Ar, Ne, Kr and Xe.

The deposition conditions for the absorber layer in the case of using Ar gas atmosphere as the inert gas atmosphere, for example, are as follows.

<Deposition Conditions for Absorber Layer>

Sputtering gas: Ar

Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa Input power: 30 to 1,000 W, preferably 50 to 750 W, more preferably 80 to 500 W Deposition rate: 0.5 to 60 nm/min, preferably 1.0 to 45 nm/min, more preferably 1.5 to 30 nm/min The above conditions are for the case where the sputtering gas is Ar; however, in a case where an inert gas other than Ar or a plurality of types of inert gases is used as the sputtering gas, the total concentration of the inert gas is set to be within the same concentration range as the above Ar gas concentration. Further, in the case where the absorber layer contains N, a mixed gas of an inert gas and $N_2$ is used, in the case where the absorber layer contains H, a mixed gas of an inert gas and $H_2$ is used, and in the case where the absorber layer contains N and H, a mixed gas of an inert gas, $N_2$ and $H_2$ is used, as the sputtering gas. In each case, the $N_2$ concentration, the $H_2$ concentration or the total concentration of $N_2$ and $H_2$, in the sputtering gas is set to be from 3 to 80 vol %, preferably from 5 to 60 vol %, more preferably from 10 to 40 vol %.

The low reflective layer 15 is composed of a film which is low reflective for inspection light to be used for inspection of a mask pattern. At the time of preparation of an EUV mask, after a pattern is formed in the absorber layer, the EUV mask is inspected whether the pattern is formed as designed. For inspection of the mask pattern, an inspection machine usually employing a light at a wavelength of about 257 nm as inspection light is used. That is, the EUV mask is inspected by the difference in the reflectivity for this light at a wavelength of about 257 nm, specifically by the difference in the reflectivity between on the exposed face from which the absorber layer 14 is removed by the pattern formation and on the surface of the absorber layer 14 remaining without being removed by pattern formation. The former face corresponds to the surface of the reflective layer 12 or a surface of the protective layer 13, usually the surface of the protective layer 13. Thus, if the difference in the reflectivity between on the surface of the reflective layer 12 or the surface of the protective layer 13 and on the surface of the absorber layer 14 for light at a wavelength of the inspection light is small, the contrast tends to be poor at the time of inspection and accurate inspection will not be conducted.

The absorber layer 14 having the above-described construction has a very low EUV light reflectivity and has excellent properties as the absorber layer for the EUV mask blank 1, but with respect to the wavelength of the inspection light, its light reflectivity is not necessarily sufficiently low. Thus, the difference between the reflectivity on the surface of the absorber layer 14 and the reflectivity on the surface of the reflective layer 12 or the surface of the protective layer 13 at a wavelength of the inspection light is small, and no sufficient contrast may be obtained at the time of inspection. If no sufficient contrast can be obtained at the time of inspection, defects of the pattern cannot sufficiently be judged at the time of mask inspection, and the defect test cannot be conducted accurately.

In the EUV mask blank 1 of the present invention, by forming a low reflective layer 15 on the absorber layer 14, the light reflectivity at the wavelength of the inspection light becomes very low, and a good contrast will be obtained at the time of inspection. Specifically, when the surface of the low reflective layer 15 is irradiated with light at the wavelength range of the inspection light, the maximum light reflectivity at the wavelength of the inspection light is preferably at most 15%, more preferably at most 10%, furthermore preferably at most 5%.

When the low reflective layer 15 has a light reflectivity of at most 15% at a wavelength of the inspection light, a good contrast at the time of inspection will be obtained. Specifically, the contrast between the reflected light at a wavelength of the inspection light on the surface of the reflective layer 12 or the surface of the protective layer 13 and the reflected light at a wavelength of the inspection light on the surface of the low reflective layer 15, will be at least 30%.

In this specification, the contrast can be determined by the following formula.

$$\text{Contrast}(\%) = ((R_2 - R_1)/(R_2 + R_1)) \times 100$$

Figure 2:
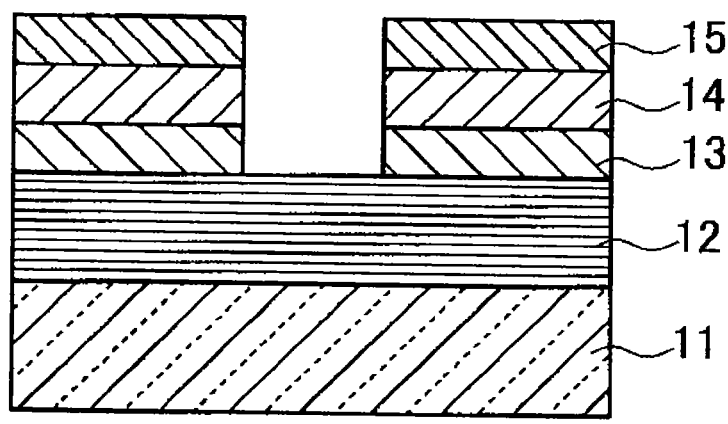
FIG. 2 is a view illustrating a state where a pattern is formed in an absorber layer 14 (and a low reflective layer 15) of the EUV mask blank 1 shown in FIG. 1.

Here, $R_2$ is the reflectivity at a wavelength of the inspection light on the surface of the reflective layer 12 or the surface of the protective layer 13, and $R_1$ is the reflectivity at a wavelength of the inspection light on the surface of the low reflective layer 15. The above $R_1$ and $R_2$ are measured in a state where a pattern is formed in the absorber layer 14 of the EUV mask blank 1 shown in FIG. 1, as shown in FIG. 2. In the case where the low reflective layer 15 is formed on the surface of the absorber layer 14, they are measured in a state where a pattern is formed in the absorber layer 14 and the low reflective layer 15. The above $R_2$ is a value measured on the surface of reflective layer 12 or the surface of the protective layer 13 exposed to the outside, from which the absorber layer 14 and the low reflective layer 15 are removed by pattern formation in FIG. 2, and $R_1$ is a value measured on the surface of the low reflective layer 15 remaining without being removed by pattern formation.

In the case where the EUV mask blank of the present invention has a low reflective layer, the contrast represented by the above formula is more preferably at least 45%, furthermore preferably at least 60%, particularly preferably at least 80%.

The low reflective layer 15 is preferably made of a material having a lower refractive index at a wavelength of the inspection light than that of the absorber layer 14, and it is preferably in an amorphous state, in order to achieve the above properties.

The low reflective layer 15 of the EUV mask blank 1 of the present invention contains at least one member selected from the group consisting of tantalum (Ta), palladium (Pd), silicon (Si) and hafnium (Hf), and at least one member selected from the group consisting of oxygen (O) and (N), whereby the above properties may be achieved. As a preferred example of such a low reflective layer 15, at least one member selected from the group consisting of a TaPdO layer, a TaPdON layer, a TaO layer, a TaON layer, a SiO layer, a SiON layer, a SiN layer, a HfO layer, a HfON layer, a TaHfO layer and a TaHfON layer may preferably be mentioned.

The total content of Ta, Pd, Si and Hf in the low reflective layer 15 is preferably from 10 to 55 at %, particularly preferably from 10 to 50 at %, because it is thereby possible to control the optical properties at the wavelength range of the pattern inspection light.

Further, the total content of O and N in the low reflective layer is preferably from 45 to 90 at %, particularly preferably from 50 to 90 at %, because it is thereby possible to control the optical properties at the wavelength range of the pattern inspection light. Further, the total content of Ta, Pd, Si, Hf, O and N in the low reflective layer 15 is preferably from 95 to 100 at %, more preferably from 97 to 100 at %, further preferably from 99 to 100 at %.

It is preferred that the low reflective layer 15 contains no Cr with a view to preventing increase in the film stress of the low reflective layer. The content of Cr is preferably at most 5 at %, particularly preferably at most 3 at %, and it is further preferred that no Cr is contained.

The low reflective layer 15 has the above construction, whereby the crystalline state is amorphous, and the surface is excellent in smoothness. Specifically, the surface roughness (rms) of the surface of the low reflective layer 15 is at most 0.5 nm.

As described above, for the purpose of preventing deterioration in the dimension accuracy of the pattern by the influence of edge roughness, the surface of the absorber layer 14 is required to be smooth. Since the low reflective layer 15 is formed on the absorber layer 14, the surface of the low reflective layer 15 is required to be smooth for the same reason.

When the surface roughness (rms) of the surface of the low reflective layer 15 is at most 0.5 nm, the surface of the low reflective layer 15 is sufficiently smooth, and thus the dimension accuracy of the pattern will not deteriorate due to the influence of the edge roughness. The surface roughness (rms) of the surface of the low reflective layer 15 is more preferably at most 0.4 nm, further preferably at most 0.3 nm.

From the viewpoint of reducing the surface roughness, the low reflective layer 15 preferably contains N.

Whether the crystalline state of the absorber layer is amorphous, i.e. whether the low reflective layer 15 has an amorphous structure or a microcrystal structure, may be determined by a X-ray diffraction (XRD) method. When the crystalline state of the low reflective layer 15 is an amorphous structure or a microcrystal structure, no sharp peak will be observed among the diffraction peaks obtained by the XRD measurement.

In the case where the low reflective layer 15 is formed on the absorber layer 14, the total thickness of the absorber layer 14 and the low reflective layer 15 is preferably from 25 to 80 nm, more preferably from 25 to 60 nm. Further, if the thickness of the low reflective layer 15 is larger than the thickness of the absorber layer 14, the EUV light absorption property of the absorber layer 14 may be reduced, and thus the thickness of the low reflective layer 15 is preferably smaller than the thickness of the absorber layer. Accordingly, the thickness of the low reflective layer 15 is preferably from 5 to 30 nm, more preferably from 10 to 20 nm.

The low reflective layer 15 having the above construction may be formed by carrying out a sputtering method by using a target containing at least one member selected from the group consisting of Ta, Pd, Si and Hf. As the target, one type of a target containing two or more types of the above metals may be used, two or more types of metal targets of the above metals may be separately used, or a compound target of two or more types of the above metals may be used.

It is advantageous to use two or more types of metal targets separately to control the components of the low reflective layer 15. In a case of using two or more types of metal targets, the components of the low reflective layer 15 may be controlled by adjusting the input power for the target. On the other hand, in a case of using a compound target, it is preferred to preliminarily adjust the target composition so that the low reflective layer 15 to be formed will have a desired composition.

The sputtering method using the above target is carried out in an inert gas atmosphere in the same manner as in the sputtering method for forming the absorber layer.

However, in the case where the low reflective layer 15 contains $O_2$ the sputtering method is carried out in an inert gas atmosphere containing $O_2$ and at least one member selected from the group consisting of He, Ar, Ne, Kr and Xe. In the case where the low reflective layer 15 contains N, the sputtering method is carried out in an inert gas atmosphere containing $N_2$ and at least one member selected from the groups consisting of He, Ar, Ne, Kr and Xe. In the case where the low reflective layer 15 contains O and N, the sputtering method is carried out in an inert gas atmosphere containing $O_2$, $N_2$ and at least one member selected from the group consisting of He, Ar, Ne, Kr and Xe.

The specific conditions for carrying out a sputtering method depend upon the target to be used and the composition of the inert gas atmosphere used for the sputtering. However, in any cases, the sputtering method may be carried out under the following conditions.

The deposition conditions for the low reflective layer in the case of using a mixed gas atmosphere of Ar and $O_2$ as the inert gas atmosphere, for example, are as follows.

<Deposition Conditions for Low Reflective Layer>

Atmosphere pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa Sputtering gas: mixed gas of Ar and $O_2$ (the $O_2$ gas concentration is from 3 to 80 vol %, preferably from 5 to 60 vol %, more preferably from 10 to 40 vol %.)

Input power: 30 to 1,000 W, preferably 50 to 750 W, more preferably 80 to 500 W

Deposition rate: 0.01 to 60 nm/min, preferably 0.05 to 45 nm/min, more preferably 0.1 to 30 nm/min In a case of using an inert gas other than Ar or a plurality of types of inert gases, the total concentration of the inert gas is set to be within the same concentration range as the above Ar gas concentration. Further, in the case where the inert gas atmosphere contains $N_2$ and in the case where the inert gas atmosphere contains $N_2$ and $O_2$, the $N_2$ concentration and the total concentration of $N_2$ and $O_2$, respectively, are set to be within the same concentration range as the above oxygen concentration.

It is preferred to form the low reflective layer 15 on the absorber layer 14 in the EUV mask blank 1 of the present invention, because the wavelength of the pattern inspection light and the wavelength of the EUV light are different. Thus, in a case where EUV light (in the vicinity of 13.5 nm) is used as the pattern inspection light, it is considered that it is not necessary to form the low reflective layer 15 on the absorber layer 14. The wavelength of the inspection light tends to shift toward a short wavelength side along with a reduction in the pattern dimension, and it is considered to shift to 193 nm or further to 13.5 nm in future. It is considered that it is not required to form the low reflective layer 15 on the absorber layer 14 when the wavelength of the inspection light is 13.5 nm.

The EUV mask blank 1 of the present invention may have a functional film known in the field of the EUV mask blank, in addition to the reflective layer 12, the protective layer 13, the absorber layer 14 and the low reflective layer 15. Specific examples of such a functional film include a highly dielectric coating to be applied on the back side of the substrate to accelerate electrostatic chucking of the substrate as disclosed in JP-A-2003-501823. Here, the back side of the substrate is meant for a face opposite to the face on which the reflective layer 12 is formed in the substrate 11 in FIG. 1. The electrical conductivity of a constituent material and the thickness of the highly dielectric coating to be applied on the back side of the substrate for the above purpose are selected so that the sheet resistance will be at most $100\Omega/\square$. As the constituent material of the highly dielectric coating can be widely selected from ones disclosed in known literature. For example, a highly dielectric coating as disclosed in JP-A-2003-501823, specifically, a coating comprising silicon, TiN, molybdenum, chromium or TaSi can be applied. The thickness of the highly dielectric coating may, for example, be from 10 to 1,000 nm.

The highly dielectric coating can be formed by a known film deposition method, e.g. sputtering such as magnetron sputtering method or ion beam sputtering method, a CVD method, a vacuum deposition method or an electrolytic plating method.

EXAMPLES

Now, the present invention will be described in further detail with reference to Examples.

Example 1

In this Example, an EUV mask blank 1 shown in FIG. 1 was prepared.

As a substrate 11 for film deposition, a $SiO_2$—$TiO_2$ glass substrate (outer dimensions of 6 inch (152 mm) square and a thickness of 6.3 mm) was used. This glass substrate has a thermal expansion coefficient of $0.2 \times 10^{-7}/°$ C. at 20° C., a Young's modulus of 67 GPa, a Poisson's ratio of 0.17 and a specific rigidity of $3.07 \times 10^7$ $m^2/s^2$. The glass substrate was polished so as to have a smooth surface with a surface roughness (rms) of at most 0.15 nm and a flatness of at most 100 nm.

On the back side of the substrate 11, a highly dielectric coating with a sheet resistance of $100\Omega/\square$ was applied by depositing a Cr film with a thickness of 100 nm by magnetron sputtering method.

The substrate 11 (outer dimensions of 6 inch (152 mm) square and a thickness of 6.3 mm) was fixed to a common electrostatic chuck in a flat plate shape using the formed Cr film, and a cycle comprising alternately depositing Si films and Mo films on the surface of the substrate 11 by ion beam sputtering method was repeated 40 cycles to form a Si/Mo multilayer reflective film (reflective layer 12) having a total film thickness of 272 nm ((4.5 nm+2.3 nm)×40).

Further, on the Si/Mo multilayer reflective film (reflective layer 12), a Ru film (thickness: 2.5 nm) was formed by using an ion beam sputtering method to form a protective layer 13.

The deposition conditions for the Si films, the Mo films and the Ru film are as follows.

<Deposition Conditions for Si Films>

Target: Si target (doped with boron)
Sputtering gas: Ar gas (gas pressure 0.02 Pa)
Voltage: 700 V
Deposition rate: 0.077 nm/sec
Film thickness: 4.5 nm <Deposition Conditions for Mo Films>

Target: Mo target
Sputtering gas: Ar gas (gas pressure 0.02 Pa)
Voltage: 700 V
Deposition rate: 0.064 nm/sec
Film thickness: 2.3 nm <Deposition Conditions for Ru Film>

Target: Ru target
Sputtering gas: Ar gas (gas pressure: 0.02 Pa)
Voltage: 500 V
Deposition rate: 0.023 nm/sec
Film thickness: 2.5 nm Next, on the protective layer 13, a TaPd film containing Ta and Pd wherein the content of Pd is larger than the content of Ta was formed as an absorber layer 14 by using a magnetron sputtering method.

The absorber layer 14 (TaPd film) was formed by the following method. The film composition is measured by using a X-ray photoelectron spectrometer (manufactured by PERKIN ELEMER-PHI), a secondary ion mass spectrometer (manufactured by PHI-ATOMIKA) and a Rutherford backscattering spectrometer (manufactured by Kobe Steel, Ltd.). The composition of the absorber layer 14 is Ta:Pd=32:68. In the composition of the absorber layer 14, O and Cr were not detected.

<Deposition Conditions for Absorber Layer 14 (TaPd Film)>

Target: Ta target and Pd target
Sputtering gas: Ar gas (gas pressure: 0.3 Pa)
Input power: 150 W for Ta target and 75 W for Pd target
Deposition rate: 18.9 nm/min
Film thickness: 50 nm With respect to the absorber layer 14 (TaPd film) of the EUV mask blank obtained in the above-described procedure, the following evaluations (1) to (4) were carried out.

(1) Crystalline State

The crystalline state of the absorber layer 14 (TaPd film) was investigated by using a X-ray diffractometer (manufactured by Rigaku Corporation). No sharp peak was shown among the obtained diffraction peaks, and thus it was confirmed that the crystalline state of the observer layer 14 was an amorphous structure or a microcrystal structure.

(2) Surface Roughness

The surface roughness of the absorber layer 14 (TaPd film) was measured by using an atomic force microscope (SPI-3800, manufactured by SII) in dynamic force mode. The area for measurement for surface roughness is 1 μm×1 μm, and SI-DF40 (manufactured by SII) is used as a cantilever. The surface roughness (rms) of the absorber layer 14 was 0.28 nm.

(3) Film Stress

The film stress of the absorber layer 14 (TaPd film) was evaluated by forming the film on a 4 inch-wafer under the same conditions as the above-described deposition conditions and measuring the change in amount of curvature of the substrate before and after film deposition. The amount of curvature of the substrate was measured by using a stress measuring apparatus (FLX-2320, manufactured by KLA-Tencor). The film stress of the absorber layer 14 was 188 MPa, which was within the range of film stress (within ±200 MPa) required for the EUV mask blank.

(4) Optical Constants in EUV Wavelength Region

The optical constants of the absorber layer 14 (TaPd film) in the EUV wavelength region was evaluated by forming the film on a 4 inch-wafer under the same conditions as the above-described deposition conditions and measuring "angle dependency" of the reflectivity in the 13.5 nm region. EUV reflectivity, incident angle of EUV light and optical constants are represented by the following formula:

$$R = |(\sin\theta - ((n+ik)^2 - \cos^2\theta)^{1/2})/(\sin\theta + ((n+ik)^2 - \cos^2\theta)^{1/2})|$$

wherein θ is an incident angle of EUV light, R is an EUV reflectivity at an incident angle θ, n is a refractive index of the absorber layer 14, and k is an extinction coefficient of the absorber layer 14. The optical constants (n and k) may be estimated by fitting measured values of the reflectivity at respective EUV incident angles. As a result of the measurement, the optical constants of the absorber layer 14 were n=0.8858 and k=0.0586, which were confirmed to be within the desirable ranges for reducing the thickness of the absorber layer.

Next, on the absorber layer 14, a low reflective layer 15 (TaPdON film) containing Ta, Pd, O and N was formed by using a magnetron sputtering method to obtain an EUV mask blank 1 comprising a substrate 11, and a reflective layer 12, a protective layer 13, an absorber layer 14, and a low reflective layer 15 formed in this order on the substrate 11.

The deposition conditions for the low reflective layer 15 (TaPdON film) are as follows.

<Deposition Conditions for Low Reflective Layer 15 (TaPdON Film)>

Target: Ta target and Pd target

Sputtering gas: mixed gas of Ar, $O_2$ and $N_2$ (Ar: 50 vol %, $O_2$: 36 vol %, $N_2$: 14 vol %, gas pressure: 0.3 Pa)

Input power: 50 W for Ta target and 100 W for Pd target

Deposition rate: 10.0 nm/min

Film thickness: 10 nm

With respect to the low reflective layer 15 (TaPdON film) of the EUV mask blank obtained by the above procedure, the following evaluations (1) to (4) were carried out.

(1) Film Composition

The composition of the low reflective layer 15 (TaPdON film) is measured by using a X-ray photoelectron spectrometer (manufactured by PERKIN ELEMER-PHI) and a Rutherford backscattering spectrometer (manufactured by Kobe Steel, Ltd.). The compositional ratio (at %) of the low reflective layer is Ta:Pd:O:N=21:14:55:10.

(2) Crystalline State

The crystalline state of the low reflective layer 15 (TaPdON film) was investigated by using a X-ray diffractometer (manufactured by Rigaku Corporation). No sharp peak was shown among the obtained diffraction peaks, and thus it was confirmed that the crystalline state of the low reflective layer 15 (TaPdON film) was an amorphous structure or a microcrystal structure.

(3) Surface Roughness

The surface roughness of the low reflective layer 15 (TaPdON film) is measured by using an atomic force microscope (SPI-3800, manufactured by SII) in dynamic force mode. The area for measurement for surface roughness is 1 μm×1 μm, and SI-DF40 (manufactured by SII) is used as a cantilever. The surface roughness (rms) of the low reflective layer is 0.30 nm.

(4) Evaluation of Reflection Properties (Evaluation of Contrast)

In this example, at the stage where up to the protective layer 13 (Ru film) is formed, the reflectivity for inspection light (wavelength: 257 nm) for a mask pattern on the surface of the protective layer 13 is measured by means of a spectrophotometer (HITACHI UV-4100). Further, after the formation of the low reflective layer 15 (TaPdON film), the reflectivity for inspection light for a mask pattern on the surface of the low reflective layer is measured. As a result, the reflectivity at a wavelength of 257 nm on the surface of the protective layer 13 is 56.0%. On the other hand, the reflectivity at a wavelength of 257 nm on the surface of the low reflective layer 15 (TaPdON film) is 14.0%, which is not greater than 15%. By using these results and the above-described formula, the contrast is calculated. As a result, the contrast at a wavelength of 257 nm is 60%.

At the wavelength of inspection light of a mask pattern, the contrast between on the surface of the protective layer 13 and on the surface of the low reflective layer 15 is not lower than 70%, and a sufficient contrast may be obtained. With respect to the obtained EUV mask blank 1, the surface of the low reflective layer 15 is irradiated with EUV light (wavelength: 13.5 nm), and the reflectivity for EUV light is measured. As a result, the reflectivity for EUV light is 4.0%, which is a sufficient EUV reflectivity to obtain the effect of phase shift.

Example 2

Example 2 is the same as Example 1 except that as the absorber layer 14, a TaPd film wherein the content of Ta is larger than the content of Pd is formed. The deposition conditions for the absorber layer 14 (TaPd film) are as follows. The film composition is measured by the same method as in Example 1. The composition of the absorber layer 14 is Ta:Pd=69:31. In the composition of the absorber layer 14, O and Cr are not detected.

<Deposition Conditions for Absorber Layer 14 (TaPd Film)>

Target: Ta target and Pd target

Sputtering gas: Ar gas (gas pressure: 0.3 Pa)

Input power: 150 W for Ta target and 50 W for Pd target

Deposition rate: 26.3 nm/min

Film thickness 50 nm

With respect to the absorber layer 14 (TaPd film) of the EUV mask blank obtained in the above procedure, the crystalline state was investigated by the same method as in Example 1, and it was confirmed that the crystalline state of the absorber layer 14 was an amorphous structure or a microcrystal structure.

Further, the surface roughness of the absorber layer 14 is measured in the same manner as in Example 1. The surface roughness (rms) of the absorber layer 14 is 0.30 nm.

Further, the film stress of the absorber layer 14 (TaPd film) was measured by the same method as in Example 1, and the film stress was −46.8 MPa, which was within the film stress range (within ±200 MPa) required for the EUV mask blank.

Further, the optical constants of the absorber layer 14 (TaPd film) in the EUV wavelength region were obtained by the same method as in Example 1, and the result was n=0.9084 and k=0.0543, which were confirmed to be within the desirable ranges for reducing the thickness of the absorber layer.

Next, on the absorber layer 14, a low reflective layer 15 (TaPdON) is formed in the same process as in Example 1 to obtain an EUV mask blank 1 comprising a substrate 11, and a reflective layer 12, a protective layer 13, an absorber layer 14 and a low reflective layer 15 formed in this order on the substrate 11.

The film composition, the crystalline structure and the surface roughness of the low reflective layer 15 (TaPdON) are the same as in Example 1.

The reflection properties of the low reflective layer 15 (TaPdON) are evaluated by the same method as in Example 1. The reflectivity for inspection light (wavelength: 257 nm) for a mask pattern is 13.5%, which is not greater than 15%.

Since the reflectivity at a wavelength of 257 nm on the surface of the protective layer 13 is 56.0%, the contrast at a wavelength of 257 nm is 62%. At the wavelength of inspection light for a mask pattern, the contrast between on the surface of the protective layer 13 and on the surface of the low reflective layer 15 is not lower than 60%, and a sufficient contrast may be obtained. With regard to the obtained EUV mask blank 1, the surface of the low reflective layer 15 (TaPdON film) is irradiated with EUV light (wavelength: 13.5 nm), and the reflectivity for EUV light is measured. As a result, the reflectivity for EUV light is 4.7%, which is a sufficient EUV reflectivity to obtain the effect of phase shift.

Example 3

Example 3 is the same as Example 1 except that as the absorber layer 14, a film (TaPdN film) containing Ta, Pd and N is formed. The deposition conditions for the absorber layer 14 (TaPdN) are as follows. The film composition is measured in the same manner as in Example 1. The composition of the absorber layer 14 is Ta:Pd:N=41:25:34. In the composition of the absorber layer, O and Cr are not detected.

<Deposition Conditions for Absorber Layer 14 (TaPdN Film)>

Target: Ta target and Pd target
Sputtering gas: mixed gas of Ar and $N_2$ (Ar: 86 vol %, $N_2$: 14 vol %, gas pressure: 0.3 Pa)
Input power: 150 W for Ta target and 75 W for Pd target
Deposition rate: 19.1 nm/min
Film thickness: 50 nm With respect to the absorber layer 14 (TaPdN film) of the EUV mask blank obtained in the above procedure, the crystalline state was investigated by the same method as in Example 1, and it was confirmed that the crystalline state of the absorber layer 14 was an amorphous structure or a microcrystal structure.

Further, the surface roughness of the absorber layer 14 is measured in the same manner as in Example 1. The surface roughness (rms) of the absorber layer 14 is 0.30 nm.

Further, the film stress of the absorber layer 14 (TaPdN film) was measured by the same method as in Example 1, and the film stress was −55.8 MPa, which was within the film stress range (within ±200 MPa) required for the EUV mask blank.

Further, the optical constants of the absorber layer 14 (TaPdN film) in the EUV wavelength region were obtained by the same method as in Example 1, and the result was n=0.8774 and k=0.0453, which were confirmed to be within the desirable ranges for reducing the thickness of the absorber layer.

Next, on the absorber layer 14, a low reflective layer 15 (TaPdON) is formed in the same process as in Example 1 to obtain an EUV mask blank 1 comprising a substrate 11, and a reflective layer 12, a protective layer 13, an absorber layer 14 and a low reflective layer 15 formed in this order on the substrate 11.

The film composition, the crystalline structure and the surface roughness of the low reflective layer 15 (TaPdON) are the same as in Example 1.

The reflection properties of the low reflective layer 15 (TaPdON) are evaluated by the same method as in Example 1. The reflectivity for inspection light (wavelength: 257 nm) for a mask pattern is 13.8%, which is not greater than 15%.

Since the reflectivity at a wavelength of 257 nm on the surface of the protective layer 13 is 56.0%, the contrast at a wavelength of 257 nm is 60.4%. At the wavelength of inspection light for a mask pattern, the contrast between on the surface of the protective layer 13 and on the surface of the low reflective layer 15 is not lower than 60%, and a sufficient contrast may be obtained. With regard to the obtained EUV mask blank 1, the surface of the low reflective layer 15 (TaPdON film) is irradiated with EUV light (wavelength: 13.5 nm), and the reflectivity for EUV light is measured. As a result, the reflectivity for EUV light is 5.6%, which is a sufficient EUV reflectivity to obtain the effect of phase shift.

Example 4

Example 4 is the same as Example 3 except that as the low reflective layer 15, a TaON film is formed. On the absorber layer 14 (TaPdN), a low reflective layer 15 (TaON film) containing Ta, O and N is formed by using a magnetron sputtering method to obtain an EUV mask blank 1 comprising a substrate 11, and a reflective layer 12, a protective layer 13, an absorber layer 14 and a low reflective layer 15 formed in this order on the substrate 11.

The deposition conditions for the low reflective layer 15 are as follows.

<Deposition Conditions for Low Reflective Layer 15 (TaON Film)>

Target: Ta target
Sputtering gas: mixed gas of Ar, $N_2$ and $O_2$ (Ar: 36 vol %, $N_2$: 14 vol %, $O_2$: 50 vol %, gas pressure: 0.3 Pa)
Input power: 450 W
Deposition rate: 0.28 nm/min
Film thickness: 10 nm The compositional ratio (at %) of the low reflective layer was measured by the same method as in Example 1, and the result is Ta:N:O=22.1:4.4:73.5.

The crystalline state of the low reflective layer 15 (TaON film) is investigated by the same method as in Example 1. The crystalline state of the low reflective layer 15 is an amorphous structure or a microcrystal structure.

Further, the surface roughness of the low reflective layer 15 (TaON film) is measured in the same manner as in Example 1. The surface roughness (rms) of the low reflective layer 15 is 0.28 nm.

The reflection properties of the low reflective layer 15 (TaON) are evaluated by the same method as in Example 1. The reflectivity for inspection light (wavelength: 257 nm) for a mask pattern is 3.3%, which is not greater than 15%.

Since the reflectivity at a wavelength of 257 nm on the surface of the protective layer 13 is 56.0%, the contrast at a wavelength of 257 nm is 89.0%. At the wavelength of inspection light for a mask pattern, the contrast between on the surface of the protective layer 13 and on the surface of the low reflective layer 15 is not lower than 70%, and a sufficient contrast may be obtained. With regard to the obtained EUV mask blank 1, the surface of the low reflective layer 15 (TaON film) is irradiated with EUV light (wavelength: 13.5 nm), and the reflectivity for EUV light is measured. As a result, the reflectivity for EUV light is 4.8%, which is a sufficient EUV reflectivity to obtain the effect of phase shift.

Example 5

Example 5 is the same as Example 3 except that as the low reflective layer 15, a SiN film is formed. On the absorber layer 14 (TaPdN), a low reflective layer 15 (SiN film) containing Si and N is formed by using a magnetron sputtering method to obtain an EUV mask blank 1 comprising a substrate 11, and a reflective layer 12, a protective layer 13, an absorber layer 14 and a low reflective layer 15 formed in this order on the substrate 11.

The deposition conditions for the low reflective layer 15 are as follows.

<Deposition Conditions for Low Reflective Layer 15 (SiN Film)>
Target: Si target
Sputtering gas: mixed gas of Ar and $N_2$ (Ar: 20 vol %, $N_2$: 80 vol %, gas pressure: 0.3 Pa)
Input power: 150 W
Deposition rate: 2 nm/min
Film thickness: 12 nm The compositional ratio (at %) of the low reflective layer 15 is measured by the same method as in Example 1, and the result is Si:N=34:66.

The crystalline state of the low reflective layer 15 (SiN film) is investigated by the same method as in Example 1. The crystalline state of the low reflective layer 15 (SiN film) is an amorphous structure or a microcrystal structure.

Further, the surface roughness of the low reflective layer 15 (SiN film) is measured in the same manner as in Example 1. The surface roughness (rms) of the low reflective layer 15 is 0.30 nm.

The reflection properties of the low reflective layer 15 (SiN) are evaluated by the same method as in Example 1. The reflectivity for inspection light (wavelength: 257 nm) for a mask pattern is 8.4%, which is not greater than 15%.

Since the reflectivity at a wavelength of 257 nm on the surface of the protective layer 13 is 56.0%, the contrast at a wavelength of 257 nm is 73.9%. At the wavelength of inspection light for a mask pattern, the contrast between on the surface of the protective layer 13 and on the surface of the low reflective layer 15 is not lower than 70%, and a sufficient contrast may be obtained. With regard to the obtained EUV mask blank 1, the surface of the low reflective layer 15 (SiN film) is irradiated with EUV light (wavelength: 13.5 nm), and the reflectivity for EUV light is measured. As a result, the reflectivity for EUV light is 5.1%, which is a sufficient EUV reflectivity to obtain the effect of phase shift.

Example 6

Example 6 is the same as Example 3 except that as the low reflective layer 15, a HfON film is formed. On the absorber layer 14 (TaPdN), a low reflective layer 15 (HfON film) containing Hf, N and O is formed by using a magnetron sputtering method to obtain an EUV mask blank 1 comprising a substrate 11, and a reflective layer 12, a protective layer 13, an absorber layer 14 and a low reflective layer 15 formed in this order on the substrate 11.

The deposition conditions for the low reflective layer 15 are as follows.

<Deposition Conditions for Low Reflective Layer 15 (HfON Film)>
Target: Hf target
Sputtering gas: mixed gas of Ar, $N_2$ and $O_2$ (Ar: 45 vol %, $N_2$: 23 vol %, $O_2$: 32 vol %, gas pressure: 0.3 Pa)
Input power: 150 W
Deposition rate: 7.8 nm/min
Film thickness: 13 nm The compositional ratio (at %) of the low reflective layer is measured by the same method as in Example 1, and the result is Hf:N:O=50:15:35.

The crystalline state of the low reflective layer 15 (HfON film) is investigated by the same method as in Example 1. The crystalline state of the low reflective layer 15 is an amorphous structure or a microcrystal structure.

Further, the surface roughness of the low reflective layer 15 (HfON film) is measured in the same manner as in Example 1. The surface roughness (rms) of the low reflective layer 15 is 0.29 nm.

The reflection properties of the low reflective layer 15 (HfON) are evaluated by the same method as in Example 1. The reflectivity for inspection light (wavelength: 257 nm) for a mask pattern is 10.9%, which is not greater than 15%.

Since the reflectivity at a wavelength of 257 nm on the surface of the protective layer 13 is 56.0%, the contrast at a wavelength of 257 nm is 67.4%. At the wavelength of inspection light for a mask pattern, the contrast between on the surface of the protective layer 13 and on the surface of the low reflective layer 15 is not lower than 60%, and a sufficient contrast may be obtained. With regard to the obtained EUV mask blank 1, the surface of the low reflective layer 15 (SiN film) is irradiated with EUV light (wavelength: 13.5 nm), and the reflectivity for EUV light is measured. As a result, the reflectivity for EUV light is 5.0%, which is a sufficient EUV reflectivity to obtain the effect of phase shift.

Comparative Example 1

Comparative Example 1 is the same as Example 1 except that a TaN film is formed as the absorber layer 14. The deposition conditions for the absorber layer 14 (TaN film) are as follows. The film composition is measured by the same method as in Example 1. The composition of the absorber layer 14 is Ta:N=55:45.

<Deposition Conditions for TaN Layer>
Target: Ta target
Sputtering gas: mixed as of Ar and $N_2$ (Ar: 86 vol %, $N_2$: 14 vol %, gas pressure: 0.37 Pa)
Input power: 300 W
Deposition rate: 1.1 nm/min
Film thickness: 60 nm With regard to the absorber layer 14 (TaN film) of the EUV mask blank obtained in the above procedure, the crystalline state was investigated by the same method as in Example 1, and a sharp peak was observed among the obtained diffraction peaks, whereby the absorber layer was confirmed to be crystalline. Further, the surface roughness of the absorber layer 14 was measured in the same manner as in Example 1, and the surface roughness (rms) of the absorber layer 14 was 0.35 nm.

Further, the film stress of the absorber layer 14 (TaN film) was measured by the same method as in Example 1. The film stress was −3,456 MPa, which is larger than the film stress range (within ±200 MPa) required for the EUV mask blank, and there is concern that the form accuracy and the dimension accuracy of the mask transfer pattern to be transferred to a resist on a substrate such as a Si wafer may be deteriorated.

Further, the optical constants of the absorber layer 14 (TaN film) in the EUV wavelength region were obtained by the same method as in Example 1, and the result was n=0.947 and k=0.0351. Since the value of n is larger than the optical constants (n=0.945, k=0.351) of a currently common absorber layer containing Ta as the main component, the effect of reducing the thickness of the absorber layer 14 may not be obtained.

As described above, TaN is not preferred as the absorber layer 14 because the film stress is large, and the effect of reducing thickness may not be obtained.

Comparative Example 2

Comparative Example 2 is the same as Example 1 except that as the absorber layer 14, a TaPd film wherein the content of Ta is more than 80% is formed. The deposition conditions for the absorber layer 14 (TaPd film) are as follows. The film composition is measured by the same method as in Example 1. The composition of the absorber layer 14 is Ta:Pd=85:15.
<Deposition Conditions for Absorber Layer 14 (TaPd Film)>
Target: Ta target and Pd target
Sputtering gas: Ar gas (gas pressure: 0.3 Pa)
Input power: 150 W for Ta target and 30 W for Pd target
Deposition rate: 16.1 nm/min
Film thickness: 50 nm With respect to the absorber layer 14 (TaPd film) of the EUV mask blank obtained in the above procedure, the crystalline state was investigated by the same method as in Example 1, and it was confirmed that the crystalline state of the absorber layer 14 was an amorphous structure or a microcrystal structure. Further, the surface roughness of the absorber layer 14 was measured in the same manner as in Example 1. The surface roughness (rms) of the absorber layer 14 was 0.28 nm.

Further, the film stress of the absorber layer 14 (TaPd film) was measured by the same method as in Example 1. The film stress was −867.8 MPa, which is larger than the film stress range (within ±200 MPa) required for the EUV mask blank, and there is concern that the form accuracy and the dimension accuracy of the mask transfer pattern to be transferred to a resist on a substrate such as a Si wafer may be deteriorated.

Further, the optical constants of the absorber layer 14 (TaPd film) in the EUV wavelength region were obtained by the same method as in Example 1, and the result was n=0.9462 and k=0.0373. Since the values of n and k are larger than the optical constants (n=0.945, k=0.351) of a currently common absorber layer containing Ta as the main component, the effect of reducing the thickness of the absorber layer 14 may not be obtained.

As described above, the absorber layer 14 containing more than 80 at % of Ta is not preferred because the film stress is large, and the effect of reducing thickness may not be obtained.

Comparative Example 3

Comparative Example 3 is the same as Example 1 except that as the absorber layer 14, a TaPd film containing more than 90 at % of Pd is formed. The deposition conditions for the absorber layer 14 (TaPd film) are as follows. The film composition is measured by the same method as in Example 1. The composition of the absorber layer 14 is Ta:Pd=5:95.
<Deposition Conditions for Absorber Layer 14 (TaPd Film)>
Target: Ta target and Pd target
Sputtering gas: Ar gas (gas pressure: 0.3 Pa)
Input power: 30 W for Ta target and 200 W for Pd target
Deposition rate: 20.1 nm/min
Film thickness: 50 nm With respect to the absorber layer 14 (TaPd film) of the EUV mask blank obtained in the above procedure, the crystalline state was investigated by the same method as in Example 1, and it was confirmed that the crystalline state of the absorber layer 14 was a crystal structure. Further, the surface roughness of the absorber layer 14 was measured in the same manner as in Example 1. The surface roughness (rms) of the absorber layer 14 was 0.52 nm.

Further, the film stress of the absorber layer 14 (TaPd film) was measured by the same method as in Example 1. The film stress was −667.8 MPa, which is larger than the film stress range (within ±200 MPa) required for the EUV mask blank, and there is concern that the form accuracy and the dimension accuracy of the mask transfer pattern to be transferred to a resist on a substrate such as a Si wafer may be deteriorated.

Further, the optical constants of the absorber layer 14 (TaPd film) in the EUV wavelength region were obtained by the same method as in Example 1. The result was n=0.8812 and k=0.0401, and the effect of reducing the thickness of the absorber layer 14 may be expected.

As described above, it is not preferred that the absorber layer 14 contains more than 90 at % of Pd because the surface roughness may be deteriorated due to the crystal property and the film stress is large.

INDUSTRIAL APPLICABILITY

The reflective mask blank for EUV lithography of the present invention has an absorber layer having a smaller refractive index and a more desired extinction coefficient as compared with a conventional absorber layer containing Ta as the main component, whereby it is possible to reduce the thickness as compared with a conventional absorber layer, and it is possible to improve the form accuracy and the dimension accuracy of a mask transfer pattern to be transferred to a resist formed on a substrate such as a Si wafer, that is, it is industrially useful.

This application is a continuation of PCT Application No. PCT/JP2011/068967, filed on Aug. 23, 2011, which is based upon and claims the benefit of priority from Japanese Patent Application No. 2010-187049 filed on Aug. 24, 2010. The contents of those applications are incorporated herein by reference in its entirety.

REFERENCE SYMBOLS

1: EUV mask blank
11: Substrate
12: Reflective layer (multilayer reflective film)
13: Protective layer
14: Absorber layer
15: Low reflective layer

What is claimed is:

1. A mask blank for EUV lithography comprising a substrate, and a reflective layer for reflecting EUV light and an absorber layer for absorbing EUV light formed in this order on the substrate, wherein the absorber layer contains tantalum (Ta) and palladium (Pd), and in the absorber layer, the content of tantalum (Ta) is from 10 to 80 at %, the content of palladium (Pd) is from 20 to 90 at %, and the total content of Ta and Pd is from 95 to 100 at %.

2. The reflective mask blank for EUV lithography according to claim 1, wherein the absorber layer further contains nitrogen (N).

3. The reflective mask blank for EUV lithography according to claim 2, wherein in the absorber layer, the content of tantalum (Ta) is from 10 to 60 at %, the content of palladium (Pd) is from 20 to 70 at %, the content of nitrogen (N) is from 20 to 70 at %, and the total content of Ta, Pd and N is from 95 to 100 at %.

4. The reflective mask blank for EUV lithography according to claim 2, wherein the absorber layer is formed by carrying out a sputtering method by using a target containing tantalum (Ta) and/or palladium (Pd) in an inert gas atmosphere containing nitrogen ($N_2$) and at least one member selected from the group consisting of helium (He), argon (Ar), neon (Ne), krypton (Kr) and xenon (Xe).

5. The reflective mask blank for EUV lithography according to claim 1, wherein the absorber layer further contains hydrogen (H).

6. The reflective mask blank for EUV lithography according to claim 5, wherein in the absorber layer, the content of tantalum (Ta) is from 10 to 79.9 at %, the content of palladium (Pd) is from 20 to 89.9 at %, the content of hydrogen (H) is from 0.1 to 10 at %, and the total content of Ta, Pd and H is from 95 to 100 at %.

7. The reflective mask blank for EUV lithography according to claim 5, wherein the absorber layer is formed by carrying out a sputtering method by using a target containing tantalum (Ta) and/or palladium (Pd) in an inert gas atmosphere containing hydrogen ($H_2$) and at least one member selected from the group consisting of helium (He), argon (Ar), neon (Ne), krypton (Kr) and xenon (Xe).

8. The reflective mask blank for EUV lithography according to claim 1, wherein the absorber layer further contains nitrogen (N) and hydrogen (H).

9. The reflective mask blank for EUV lithography according to claim 8, wherein in the absorber layer, the content of tantalum (Ta) is from 10 to 59.9 at %, the content of palladium (Pd) is from 20 to 69.9 at %, the content of nitrogen (N) is from 20 to 69.9 at %, the content of hydrogen (H) is from 0.1 to 10 at %, and the total content of Ta, Pd, N and H is from 95 to 100 at %.

10. The reflective mask blank for EUV lithography according to claim 8, wherein the absorber layer is formed by carrying out a sputtering method by using a target containing tantalum (Ta) and/or palladium (Pd) in an inert gas atmosphere containing hydrogen ($H_2$), nitrogen ($N_2$) and at least one member selected from the group consisting of helium (He), argon (Ar), neon (Ne), krypton (Kr) and xenon (Xe).

11. The reflective mask blank for EUV lithography according to claim 1, wherein the crystalline state of the absorber layer is amorphous.

12. The reflective mask blank for EUV lithography according to claim 1, wherein the surface roughness (rms) of the surface of the absorber layer is at most 0.5 nm.

13. The reflective mask blank for EUV lithography according to claim 1, wherein the absorber layer has a thickness of from 20 to 50 nm.

14. The reflective mask blank for EUV lithography according to claim 1, wherein a low reflective layer for inspection light to be used for inspection of a mask pattern, is formed on the absorber layer, and the low reflective layer contains at least one member selected from the group consisting of tantalum (Ta), palladium (Pd), silicon (Si) and hafnium (Hf), and at least one member selected from the group consisting of oxygen (O) and nitrogen (N).

15. The reflective mask blank for EUV lithography according to claim 14, wherein in the low reflective layer, the total content of tantalum (Ta), palladium (Pd), silicon (Si) and hafnium (Hf) is from 10 to 55 at %, the total content of oxygen (O) and nitrogen (N) is from 45 to 90 at %, and the total content of Ta, Pd, Si, O and N is from 95 to 100 at %.

16. The reflective mask blank for EUV lithography according to claim 14, wherein the surface roughness (rms) of the surface of the low reflective layer is at most 0.5 nm.

17. The reflective mask blank for EUV lithography according to claim 14, wherein the low reflective layer has a thickness of from 5 to 30 nm.

18. The reflective mask blank for EUV lithography according to claim 14, wherein the reflectivity on the surface of the low reflective layer at a wavelength of the light to be used for inspection of a pattern formed in the absorber layer is at most 15%.

19. The reflective mask blank for EUV lithography according to claim 14, wherein a protective layer for protecting the reflective layer at the time of forming a pattern in the absorber layer, is formed between the reflective layer and the absorber layer, and the contrast between reflection light on the surface of the protective layer and reflection light on the surface of the low reflective layer at a wavelength of the light to be used for inspection of a pattern formed in the absorber layer is at least 30%.

20. The reflective mask blank for EUV lithography according to claim 19, wherein the protective layer is formed from any one of Ru, a Ru compound and $SiO_2$.

21. The reflective mask blank for EUV lithography according to claim 14, wherein the low reflective layer is formed by carrying out a sputtering method by using a target containing at least one member selected from the group consisting of tantalum (Ta), palladium (Pd), silicon (Si) and hafnium (Hf) in an inert gas atmosphere containing at least one member selected from the group consisting of helium (He), argon (Ar), neon (Ne), krypton (Kr) and xenon (Xe) and at least one member selected from the group consisting of oxygen ($O_2$) and nitrogen ($N_2$).

22. The reflective mask blank for EUV lithography according to claim 1, wherein the absorber layer is formed by carrying out a sputtering method by using a target containing tantalum (Ta) and/or palladium (Pd) in an inert gas atmosphere containing at least one member selected from the group consisting of helium (He), argon (Ar), neon (Ne), krypton (Kr) and xenon (Xe).

* * * * *